United States Patent
Kobayashi

(10) Patent No.: US 10,204,672 B2
(45) Date of Patent: Feb. 12, 2019

(54) MAGNETIC MEMORY DEVICE

(71) Applicant: TOSHIBA MEMORY CORPORATION, Minato-ku, Tokyo (JP)

(72) Inventor: Shinya Kobayashi, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/695,950

(22) Filed: Sep. 5, 2017

(65) Prior Publication Data

US 2018/0233190 A1 Aug. 16, 2018

(30) Foreign Application Priority Data

Feb. 10, 2017 (JP) ................. 2017-023205

(51) Int. Cl.
*G11C 11/16* (2006.01)
*H01L 43/02* (2006.01)

(52) U.S. Cl.
CPC ........ *G11C 11/1675* (2013.01); *G11C 11/161* (2013.01); *G11C 11/1655* (2013.01); *G11C 11/1657* (2013.01); *G11C 11/1659* (2013.01); *G11C 11/1693* (2013.01); *G11C 11/1695* (2013.01); *G11C 11/1697* (2013.01); *H01L 43/02* (2013.01)

(58) Field of Classification Search
CPC .............. G11C 11/1675; G11C 11/161; G11C 11/1655; G11C 11/1657; G11C 11/1659; G11C 11/1697
See application file for complete search history.

(56) References Cited

U.S. PATENT DOCUMENTS

| | | | |
|---|---|---|---|
| 6,891,742 B2 | 5/2005 | Takano et al. | |
| 7,558,139 B2 | 7/2009 | Ohsawa | |
| 8,347,175 B2 | 1/2013 | Ikegawa et al. | |
| 2016/0180908 A1* | 6/2016 | Zhou | G11C 11/1673 365/156 |
| 2016/0314826 A1* | 10/2016 | Augustine | G11C 11/1659 |
| 2017/0365338 A1* | 12/2017 | Hanyu | G11C 13/0064 |

* cited by examiner

*Primary Examiner* — Tri Hoang
(74) *Attorney, Agent, or Firm* — Foley & Lardner LLP

(57) ABSTRACT

A magnetic memory device includes a memory cell array, a counter circuit and a control circuit. The memory cell array includes a memory cell including a magneto resistive element in which writing is performed by current in a first direction or current in a second direction which is an opposite direction to the first direction. The memory cell array includes a first word line and a first bit line, both connected with the memory cell. The counter circuit counts the number of writing times in the first direction while the counter circuit is in electrical connection with the magneto resistive element. The control circuit performs writing in the second direction in the memory cell when the number of consecutive writing times in the first direction reaches a threshold number of times while the control circuit is in connection with the memory cell array.

8 Claims, 7 Drawing Sheets

PARALLEL STATE
(LOW RESISTANCE)

ANTI-PARALLEL STATE
(HIGH RESISTANCE)

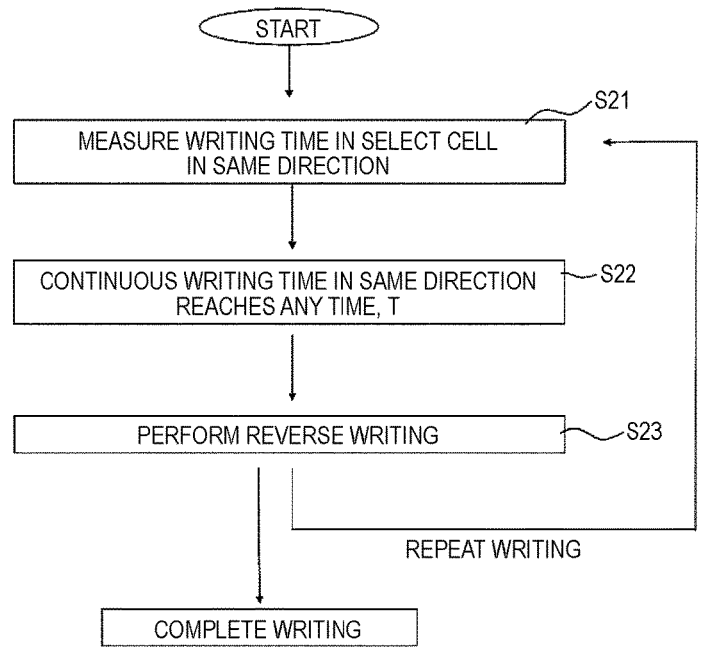
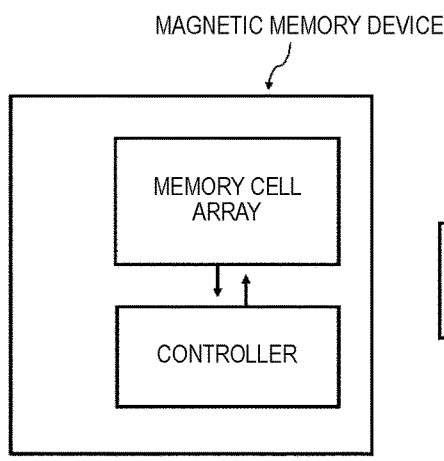
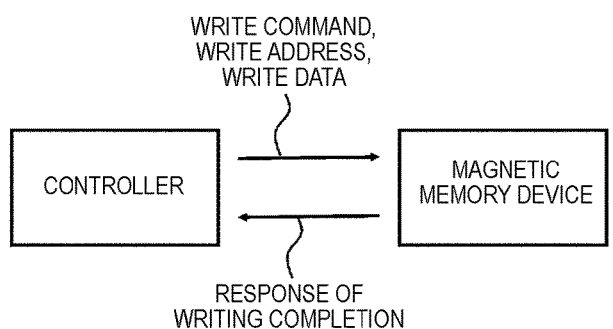

MAGNETIC MEMORY DEVICE

CROSS-REFERENCE TO RELATED APPLICATION

This application claims the benefit of and priority to Japanese Patent Application No. 2017-023205, filed Feb. 10, 2017, the entire contents of which are incorporated herein by reference.

FIELD

Embodiments described herein relate generally to a magnetic memory device.

BACKGROUND

As a nonvolatile and rewritable memory, a magnetic memory (e.g., magnetic random access memory: MRAM) is attracting attention. The MRAM has a magnetic tunnel junction (MTJ) element that utilizes a tunnel magneto resistive effect as a memory cell.

DESCRIPTION OF THE DRAWINGS

FIG. 13 is a flowchart for describing a writing method of the magnetic memory device according to some embodiments.

FIG. 14A and FIG. 14B are views for describing the magnetic memory device according to some embodiments.

DETAILED DESCRIPTION

Figure 1:
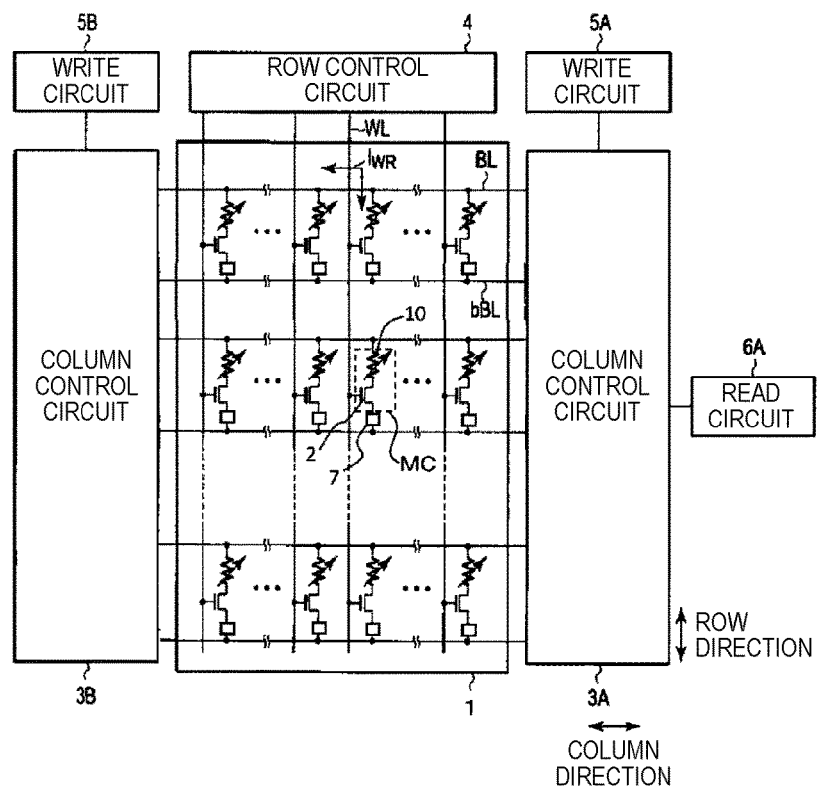
FIG. 1 is a view for describing a memory cell array of a magnetic memory device and a circuit configuration in the vicinity thereof according to some embodiments.

An example embodiment provides a magnetic memory device (MRAM) having enhanced reliability in a write operation.

In general, according to some embodiments, a magnetic memory device may include a memory cell array that includes a memory cell including a magneto resistive element in which writing is performed by current in a first direction and a second direction which is an opposite direction to the first direction and a first bit line and a first word line connected with the memory cell. In some embodiments, the magnetic memory device may include a counter circuit that counts the number of writing times in the first direction in electrical connection with the magneto resistive element. In some embodiments, the magnetic memory device may include a control circuit that performs writing in the second direction in the memory cell when the number of consecutive writing times in the first direction reaches a threshold number of times in connection with the memory cell array.

Hereinafter, some embodiments will be described.

A magnetic memory device according to some embodiments will be described with reference to FIG. 1 to FIG. 9C. Further, in describing drawings given below, the same or similar elements are denoted by the same reference numerals. Moreover, in the drawings, a relationship between a thickness and a plane dimension, a ratio, and the like may be different from the actual ones and may be only schematic.

A configuration of the magnetic memory device according to some embodiments will be described with reference to FIG. 1 to FIG. 5. FIG. 1 is a schematic view illustrating one example of a memory cell array 1 of a magnetic memory device and a circuit configuration in the vicinity thereof according to some embodiments.

As illustrated in FIG. 1, in some embodiments, a plurality of bit lines BL and bBL and a plurality of word lines WL are provided in the memory cell array 1. In some embodiments, the bit lines BL and bBL extend in a column direction and the word lines WL extend in a row direction. In some embodiments, two bit lines BL and bBL form one pair of bit lines.

In some embodiments, referring to FIG. 1, the memory cell array 1 includes a plurality of memory cells MC. In some embodiments, the plurality of memory cells MC are disposed in an array type in the memory cell array 1. In some embodiments, the memory cells MC are connected to the bit line BL and the word line WL. In some embodiments, the plurality of memory cells MC arranged in the column direction are connected to a common bit line BL. The plurality of memory cells MC arranged in the row direction are connected to a common word line WL. In some embodiments, the memory cells MC are connected even to a common bit line bBL in the column direction through a counter circuit 7.

In some embodiments, the memory cell MC includes, for example, one MTJ element 10 as a memory element and one select switch 2. In some embodiments, any other configuration of a memory cell may be used.

In some embodiments, the select switch 2 may be, for example, a field effect transistor.

In some embodiments, one end of the MTJ element 10 is connected to the bit line BL and the other end of the MTJ element 10 is connected to one end of a current path of the select transistor 2. In some embodiments, the one end of the current path of the select transistor 2 may be a source of the select transistor 2 or a drain of the select transistor 2.

In some embodiments, the memory cell MC is, for example, connected to the bit line bBL through the counter circuit 7 that counts the number of write times in the memory cell MC. In some embodiments, the other end of the current path of the select transistor 2 is connected to the bit line bBL through the counter circuit 7. In some embodiments, the other end of the current path of the select transistor 2 may be a source of the select transistor 2 or a drain of the select transistor 2. In some embodiments, a control terminal (e.g., gate) of the select transistor 2 is connected to the word line WL. In some embodiments, the counter circuit 7 may be located in a location other than that shown in FIG. 1. In some embodiments, the counter circuit 7 may selectively count the number of write times in one memory cell MC, and may be installed between the memory cell MC and the bit line BL, and installed between the MTJ element 10 and the select transistor 2. In some embodiments, the counter circuit may be installed outside of the memory cell array 1 and in a controller electrically connected with the MTJ element 10 (to be described below).

In some embodiments, one end of the word line WL is connected to a row control circuit 4. In some embodiments, the row control circuit 4 may control activation or deactivation of the word line WL based on an address signal from the outside. In some embodiments, column control circuits 3A and 3B are connected to one end and the other end of the bit line BL, respectively. In some embodiments, column control circuits 3A and 3B are connected to one end and the other end of the bit line bBL, respectively. In some embodiments, the column control circuits 3A and 3B may control activation or deactivation of the bit lines BL and bBL based on the address signal from the outside.

In some embodiments, write circuits 5A and 5B are connected to one end and the other end of the bit line BL through the column control circuits 3A and 3B, respectively. In some embodiments, write circuits 5A and 5B are connected to one end and the other end of the bit line bBL through the column control circuits 3A and 3B, respectively. In some embodiments, the write circuit 5A may have a source circuit such as a current source or a voltage source for generating write current and a synch circuit for absorbing the write current. In some embodiments, the write circuit 5B may have a source circuit such as a current source or a voltage source for generating write current and a synch circuit for absorbing the write current.

In some embodiments, a read circuit 6A is connected to one end and the other end of the bit line BL through the column control circuits 3A and 3B, respectively. In some embodiments, a read circuit 6A is connected to one end and the other end of the bit line bBL through the column control circuits 3A and 3B, respectively. In some embodiments, the read circuit 6A may include the voltage source or the current source generating read current or a sense amplifier sensing and amplifying a read signal, a latch circuit temporarily holding data, and the like.

In some embodiments, as shown in FIG. 1, the read circuit 6A is installed at one end in the column direction. In some embodiments, two read circuits may be installed at one end and the other end in the column direction, respectively.

In some embodiments, a circuit (hereinafter referred to as "peripheral circuit") other than the row/column control circuit, the write circuit, and the read circuit may be installed in the same chip as the memory cell array 1. In some embodiments, a buffer circuit, a state machine (e.g., control circuit), an error checking and correcting (ECC) circuit, or the like may be installed in the chip as the peripheral circuit.

Subsequently, the memory cell MC will be described in detail.

Figure 2:
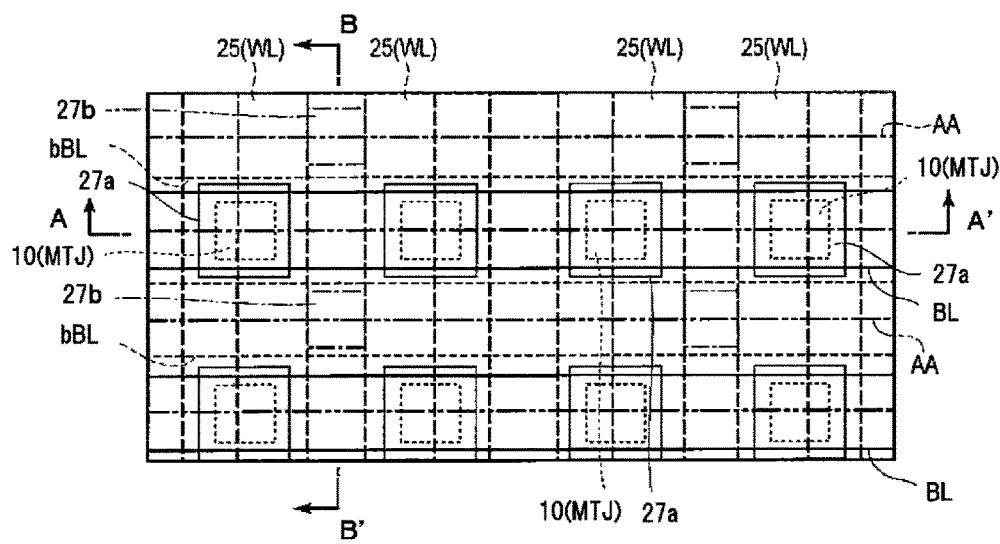
FIG. 2 is a plan view of the memory cell array of a magnetic memory device according to some embodiments.
Figure 3:
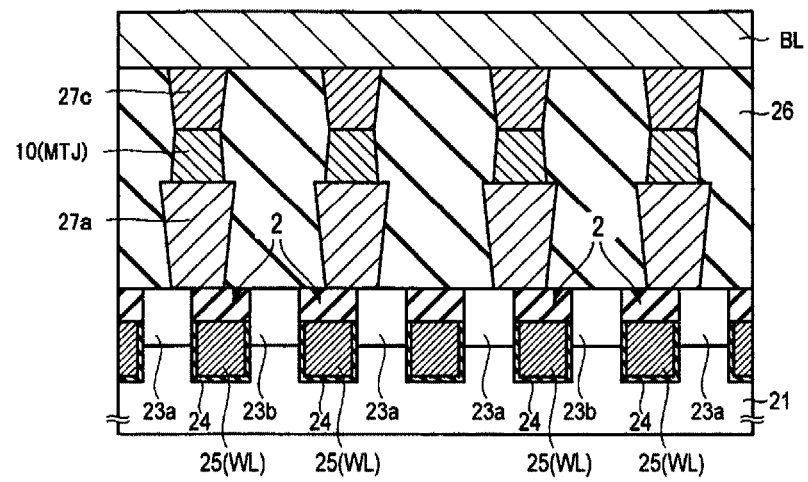
FIG. 3 is a cross-sectional view illustrating a cross section taken along line A-A' of FIG. 2.
Figure 4:
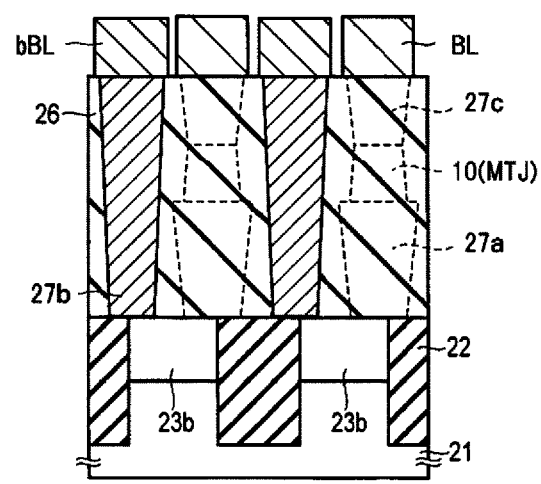
FIG. 4 is a cross-sectional view illustrating a cross section taken along line B-B' of FIG. 2.

FIG. 2 is a schematic plan view illustrating a part of the memory cell array of FIG. 1. FIG. 3 is a cross-sectional view taken along line A-A' in FIG. 2. FIG. 4 is a cross-sectional view taken along line B-B' in FIG. 2.

In some embodiments, the select transistor 2 is disposed in an active area AA in a semiconductor substrate 21 (see FIG. 2 and FIG. 3). In some embodiments, the active area AA may be partitioned by a device isolation insulating film 22 embedded in an element isolation area of the semiconductor substrate 21 (see FIG. 4). In some embodiments, the device isolation insulating film 22 (see FIG. 4) may have a shallow trench isolation (STI) structure.

In some embodiments, referring to FIG. 3, the select transistor 2 includes a source diffusion layer 23a and a drain diffusion layer 23b in the semiconductor substrate 21 and a gate insulation layer 24 and a gate electrode (word line WL) 25. In some embodiments, the semiconductor substrate 21, the gate insulation layer 24, and the gate electrode (word line WL) 25 may be formed in the semiconductor substrate 21 therebetween. In some embodiments, the select transistor 2 may have, for example, an embedded gate structure in which a gate electrode WL 25 is embedded in the semiconductor substrate 21. In some embodiments, any other structure of the select transistor 2 may be used.

In some embodiments, referring to FIG. 3, an interlayer insulating film 26 (e.g., an oxide silicon film) covers the select transistor 2. In some embodiments, contact plugs 27a and 27b are disposed in the interlayer insulating film 26 (see FIG. 3 and FIG. 4). In some embodiments, the contact plug 27a is connected to the source diffusion layer 23a or the drain diffusion layer 23b. In some embodiments, the contact plug 27a may include any one of, for example, W, Ta, TaN, or TiN. In some embodiments, the contact plug 27b may include any one of, for example, W, Ta, TaN, or TiN.

In some embodiments, referring to FIG. 3, the MTJ element 10 is disposed on the contact plug 27a. In some embodiments, a contact plug 27c is disposed on the MTJ element 10.

In some embodiments, referring to FIG. 3, the bit line BL is connected to the MTJ element 10 through the contact plug 27c. In some embodiments, the bit line bBL may serve as, for example, a source line to which a ground potential is applied while reading.

Although the counter circuit 7 is not illustrated in FIG. 2 to FIG. 4, the counter circuit 7 may be formed, for example, between the bit line BL and the contact plug 27c in FIG. 3 and formed between the bit line bBL and the contact plug 27b in FIG. 4. In some embodiments, in order to reduce a chip area, multiple counter circuits 7 may be integrated and formed at an end of the memory cell array 1, and the respective counter circuits 7 and the respective memory cells MC may be electrically connected to each other.

Subsequently, the MTJ element 10 will be described in detail.

Figure 5:
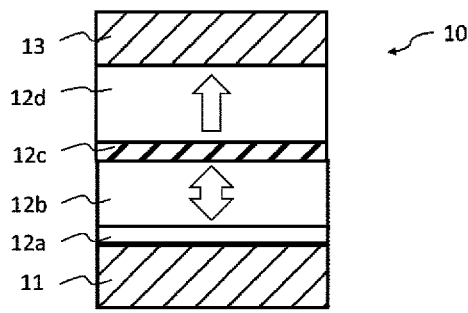
FIG. 5 is a cross-sectional view of an MTJ element of the magnetic memory device according to some embodiments.

FIG. 5 is a cross-sectional view illustrating one example of the configuration of the MTJ element 10 according to some embodiments. In some embodiments, as illustrated in FIG. 5, the MTJ element 10 is configured with an underlayer 12a, a storage layer (or free layer) 12b, a tunnel barrier layer 12c, and a reference layer (or fixation layer) 12d that are formed between a lower electrode 11 and an upper electrode 13.

In some embodiments, the underlayer 12a is formed on the lower electrode 11. In some embodiments, the underlayer 12a may be configured with, for example, W. In some embodiments, the underlayer 12a may not be formed. In some embodiments, the underlayer 12a may be integrated with the lower electrode 11.

In some embodiments, the storage layer 12b is formed on the underlayer 12a. In some embodiments, the storage layer 12b may be a ferromagnetic layer of which a magnetization direction is variable and has a perpendicular magnetic anisotropy that is perpendicular or substantially perpendicular to a film surface (e.g., upper surface or lower surface). For example, an angle formed by the storage layer 12b and the film surface varies by less than or equal to ±10% of 90°, such as less than or equal to ±5% of 90°, less than or equal to ±4% of 90°, less than or equal to ±3% of 90°, less than or equal to ±2% of 90°, or less than or equal to ±1% of 90°. Herein, the variable magnetization direction means that the magnetization direction is changed with respect to a predetermined write current. Further, substantially vertical means that a direction of residual magnetization is within a range of $45° < \theta \leq 90°$ with respect to the film surface.

In some embodiments, the storage layer 12b may be configured with a ferromagnetic body including, for example, cobalt (Co) and iron (Fe). In some embodiments, the storage layer 12b may include, for example, nickel (Ni). In some embodiments, boron (B) may be added to the ferromagnetic body for the purpose of adjusting saturation magnetization or crystal magnetic anisotropy.

In some embodiments, the tunnel barrier layer 12c is formed on the storage layer 12b. In some embodiments, the tunnel barrier layer 12c may be a non-magnetic layer and may be configured with, for example, magnesium oxide (MgO).

In some embodiments, the reference layer 12d is formed on the tunnel barrier layer 12c. In some embodiments, the reference layer 12d may be a ferromagnetic layer of which a magnetization direction is invariable and may have a perpendicular magnetic anisotropy that is perpendicular or substantially perpendicular to the film surface. For example, an angle formed by the reference layer 12d and the film surface varies by less than or equal to ±10% of 90°, such as less than or equal to ±5% of 90°, less than or equal to ±4% of 90°, less than or equal to ±3% of 90°, less than or equal to ±2% of 90°, or less than or equal to ±1% of 90°. Herein, the invariable magnetization direction means that the magnetization direction is not changed with respect to the predetermined write current. That is, in some embodiments, the reference layer 12d may have a larger inversion energy barrier of the magnetization direction than the storage layer 12b.

In some embodiments, the reference layer 12d may be configured with the ferromagnetic body including, for example, Co and Fe. In some embodiments, the reference layer 12d may include Ni. In some embodiments, B (Boron) may be added to the ferromagnetic body for the purpose of adjusting the saturation magnetization or crystal magnetic anisotropy.

In some embodiments, planar shapes of the underlayer 12a, the storage layer 12b, the tunnel barrier layer 12c, and the reference layer 12d may be, for example, circular. As a result, in some embodiments, the MTJ element 10 may be formed in a pillar shape. However, other embodiments are not limited thereto and the planar shape of the MTJ element 10 may be a square, a rectangle, an ellipse, or the like.

In some embodiments, the magnetization direction of the reference layer 12d may be fixed upward.

In some embodiments, the storage layer 12b and the reference layer 12d may have a size difference in a plane. For example, a diameter in the plane of the reference layer 12d may be smaller than the diameter of the storage layer 12b.

In some embodiments, the arrangement of the storage layer 12b and the reference layer 12d may be reversed. That is, the reference layer 12d, the tunnel barrier layer 12c, and the storage layer 12b may be sequentially formed on the lower electrode 11.

Subsequently, an example of write and read operations of the MTJ element 10 will be described.

In some embodiments, the MTJ element 10 may be, for example, a spin injection type magneto resistance effect element. Therefore, in some embodiments, when data is written in the MTJ element 10 or the data is read from the MTJ element 10, the MTJ element 10 may be bidirectionally supplied with current in a direction perpendicular to the film surface.

I In some embodiments, the data is written in the MTJ element 10 as described below.

Figure 6A:
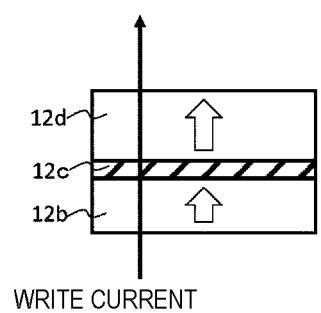
FIG. 6A and FIG. 6B are views for describing a write operation of the magnetic memory device according to some embodiments.
Figure 6B:
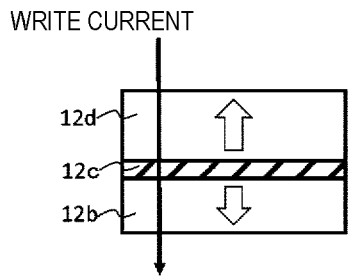

FIG. 6A is a view for explaining the write operation of the MTJ element 10 and illustrates a cross-sectional view of the MTJ element 10 in a parallel state. FIG. 6B is a view for explaining the write operation of the MTJ element 10 and illustrates the cross-sectional view of the MTJ element 10 in an anti-parallel state. Further, in the subsequent description of the MTJ element 10, the upper electrode 13, the lower electrode 11, and the underlayer 12a are not illustrated for the sake of convenience.

In some embodiments, the write circuits 5A and 5B (see FIG. 1) may supply write current to a memory cell (hereinafter referred to as "select cell") selected from the outside at the time of writing the data.

In some embodiments, the write circuits 5A and 5B may make the write current bidirectionally flow to the MTJ element 10 in the memory cell MC according to the data written in the select cell at the time of writing the data in the MTJ element 10. That is, in some embodiments, the write current that heads from the bit line BL to the bit line bBL or the write current that heads from the bit line bBL to the bit line BL may be output from the write circuits 5A and 5B according to the data written in the MTJ element 10.

In some embodiments, as illustrated in FIG. 6A, when the current flows from the lower electrode 11 to the upper electrode 13, that is, when electrons (e.g., electrons that head from the reference layer 12d to the storage layer 12b) are supplied from the upper electrode 13, electrons which are spin-polarized in the same direction as the magnetization direction of the reference layer 12d (as shown in FIG. 6A) may be injected into the storage layer 12b. In this case, the magnetization direction of the storage layer 12b (as shown in FIG. 6A) is aligned in the same direction as the magnetization direction of the reference layer 12d (as shown in FIG. 6A). As a result, in some embodiments, the magnetization direction of the reference layer 12d and the magnetization direction of the storage layer 12b may be arranged in parallel to each other. In some embodiments, in the parallel state, a resistance value of the MTJ element 10 may be the smallest. This case can be defined as, for example, data "0", in some embodiments. In this case, since the same current flows even in the counter circuit 7, in some embodiments, the counter circuit 7 may sense an input of data "0" from the direction of the current. In some embodiments, writing to a data "0" state can be referred to as "writing of '0'".

In some embodiments, as illustrated in FIG. 6B, when the current flows from the upper electrode 13 to the lower electrode 11, that is, when the electrons (the electrons that head from the storage layer 12b to the reference layer 12d) are supplied from the lower electrode 11, the electrons may be reflected by the reference layer 12d, and as a result, the electrons which are spin-polarized in a direction opposite to the magnetization direction of the reference layer 12d (as shown in FIG. 6B) are injected into the storage layer 12b. In this case, in some embodiments, the magnetization direction of the storage layer 12b (as shown in FIG. 6B) is aligned in the direction opposite to the magnetization direction of the reference layer 12d (as shown in FIG. 6B). As a result, in some embodiments, the magnetization direction of the reference layer 12d (as shown in FIG. 6B) and the magnetization direction of the storage layer 12b (as shown in FIG. 6B) are arranged in anti-parallel to each other. In the anti-parallel state, in some embodiments, the resistance value of the MTJ element 10 may be the largest. This case can be defined as, for example, data "1", in some embodiments. In this case, since the same current flows even in the counter circuit 7, in some embodiments, the counter circuit 7 may sense the input of data "1" from the direction of the current. Herein, in some embodiments, writing to a data "1" state can be referred to as "writing of '1'".

In some embodiments, the above-described writing method may be executed by a control circuit in the magnetic memory device. In that case, in some embodiments, as illustrated in FIG. 14A and FIG. 14B, the control circuit may control the operation of the magnetic memory device based on a control signal from a controller. FIG. 14A is a schematic view when the controller is installed in the magnetic memory device and FIG. 14B is a schematic view when the controller is outside the magnetic memory device. In some embodiments, the controller may include, for example, a host central processing unit (CPU), a memory controller, or the like. In some embodiments, when the data is written in the magnetic memory device, the controller may issue a write command and transmit the issued write command to the magnetic memory device. In some embodiments, the controller may transmit a write address and write data to the magnetic memory device. In some embodiments, the magnetic memory device, for example, may receive the write command and thereafter, transmit a response of write completion to the controller.

In some embodiments, the data may be read from the MTJ element 10 as described below.

In some embodiments, the read circuit 6A (see FIG. 1) may supply the read current to the select cell at the time of reading the data from the MTJ element 10. In some embodiments, a current value of the read current may be set to a value smaller than a current value (e.g., magnetization inversion threshold value) of the write current so as to prevent the magnetization of the storage layer 12b (see FIG. 5, FIG. 6A and FIG. 6B) from being inverted by the read current.

In some embodiments, the current value or potential may vary in a read node according to the size of the resistance value of the MTJ element 10 to which the read current is supplied. In some embodiments, the data "0" and "1" stored by the MTJ element 10 may be discriminated based on a variation amount (e.g., read signal and read output) according to the size of the resistance value.

Figure 7:
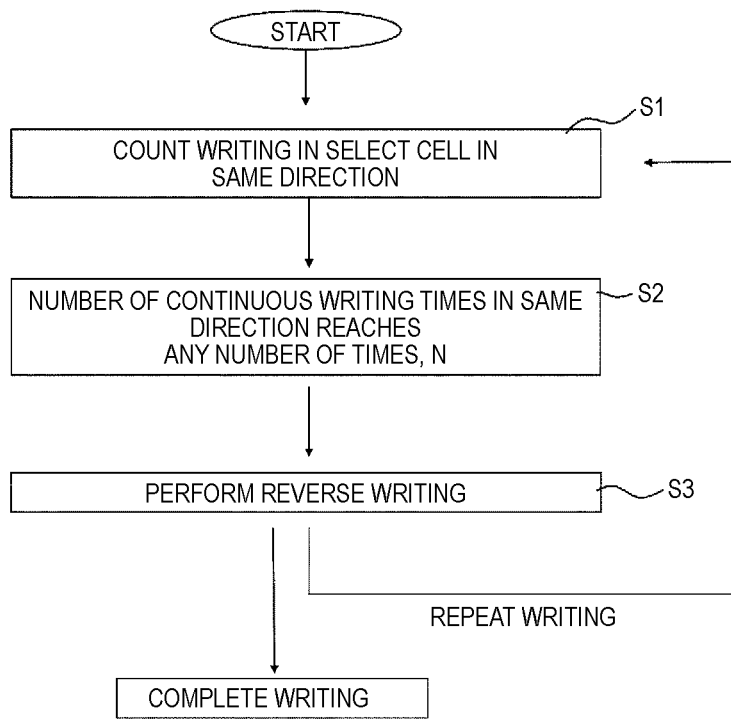
FIG. 7 is a flowchart for describing a writing method of the magnetic memory device according to some embodiments.

Subsequently, the writing method according to some embodiments will be described in detail with reference to FIG. 7 to FIG. 9C. FIG. 7 is a flowchart for explaining the writing method of some embodiments.

In some embodiments, first, writing of "0" or "1" may be repeated with respect to the select cell by the above-described write operation.

In this case, in some embodiments, since the counter circuit 7 is connected to the select cell, the counter circuit 7 may count the respective numbers of writing times by sensing writing of "0" and writing of "1" in the select cell (51). In some embodiments, the writing of "0" or "1" may be performed in the direction of the current which flows in the counter circuit as described above. In some embodiments, counting the number of writing times may be performed by counting the number of writing times in the same direction (e.g., first direction). That is, in some embodiments, any number (or a predetermined number) of writing times of "0" and "1" may be counted. For example, since the writing of "1" is performed with high voltage as compared with the writing of "0", the number of writing times of "1" may be counted.

In some embodiments, the counter circuit 7 may count the number of writing times of "1" and the writing of "1" may be continuously performed, and when the number of writing times of "1" reaches any continuous number of writing times, say N (S2), "0" may be once written in the memory cell MC through the control circuit (S3). That is, in some embodiments, the counter circuit 7 does not sense the writing of "0" once, while continuously counting the writing of "1" N times after sensing the writing of "0". In this case, in some embodiments, any number (or a predetermined number) of continuous writing times, N, may be appropriately set. In some embodiments, when the writing of "0" is performed once, a write fault may be prevented, which is caused by the writing of "1" which is continuously performed.

Figure 8:
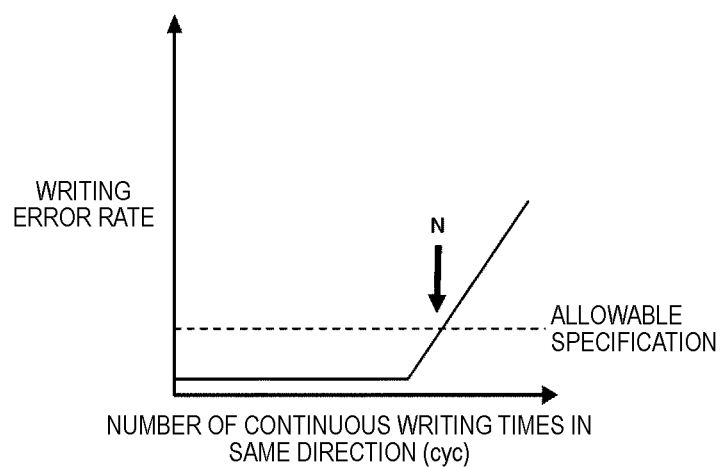
FIG. 8 is a view for describing a relationship between the number of continuous write times and an error rate.

Hereinafter, the reason will be described. FIG. 8 is a view for describing a relationship between the number of continuous writing times in the same direction and a writing error rate. As illustrated in FIG. 8, in some embodiments, when the number of writing (e.g., the writing of "1") which is continuous in the same direction increases and "1" is written again after any number (or a predetermined number) of continuous writing times, N, is reached, the writing error rate may exceed an allowable specification. Therefore, in some embodiments, when the writing of "1" is continuously performed even after the number of continuous writing times, N, an undesirable extent of writing faults may occur.

Figure 9A:
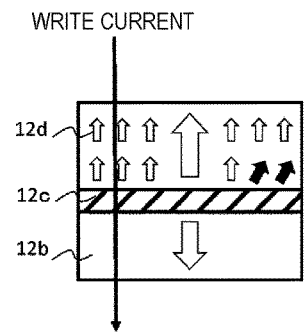
FIG. 9A, FIG. 9B and FIG. 9C are views for describing the writing method of the magnetic memory device according to some embodiments.
Figure 9B:
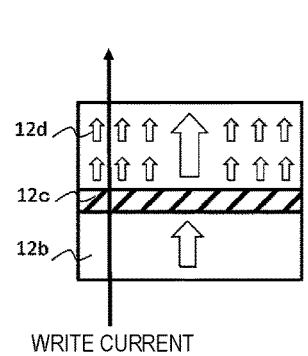
Figure 9C:
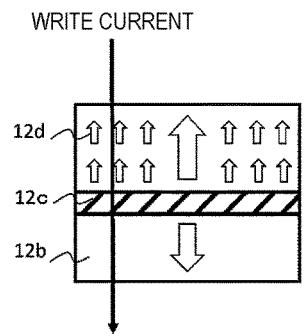

FIG. 9A is a schematic view for explaining a state of the MTJ element 10 when the number of writing times of "1" is the number of continuous writing times, N. In FIG. 9A, FIG. 9B and FIG. 9C, the direction of a magnetic field which is unstable is represented by a black arrow and a normal magnetic field direction is represented by a white arrow. In some embodiments, as illustrated in FIG. 9A, in the MTJ element 10 which continuously performs the writing of "1" N times, a partial magnetic layer of a lower part (e.g., the reference layer 12d in the vicinity of the tunnel barrier layer 12c) of the reference layer 12d may be influenced. As a result, in some embodiments, the direction of the magnetic field may become unstable. As a result, in some embodiments, when the writing of "1" is performed after the number of continuous writing times, N, is reached, it is possible that the direction of the magnetic field is not stable, and as a result, in some embodiments, normal writing of "1" may not be performed. In some embodiments, when "0" is once written in the MTJ element 10 as described above, the magnetic layer of the reference layer 12d in the vicinity of the tunnel barrier layer 12c may be stabilized as illustrated in FIG. 9B, and as a result, the direction of the magnetic field may be normally reset. That is, in some embodiments, the magnetic layer may be stabilized and reset to the normal magnetic field direction by performing writing once in an opposite magnetization direction (e.g., second direction). Thereafter, in some embodiments, even though the writing of "1" is performed, the direction of the magnetic field may be normally maintained as illustrated in FIG. 9C, and as a result, it is possible that the writing fault does not occur.

In some embodiments, when the writing of "0" is once performed, the count of the number of continuous writing times in the counter circuit 7 may be reset. Accordingly, in some embodiments, the writing of "1" may be counted again and when the number of continuous writing times of "1" reaches the number of continuous writing times, N, again, the writing of "0" may be performed again and reset as described above. In some embodiments, this process may be repeated until the writing is completed.

By the magnetic memory device according to some embodiments, the counter circuit may be installed for each memory cell to count the number of writing times. As a result, writing in the reverse direction may be performed once when continuous writing in the same direction reaches any number (or a predetermined number) of continuous writing times. As a result, the writing fault may be reduced which is caused due to continuation of the writing in the same direction.

Further, although counting the number of writing times of "1" will be described as an example, in some embodiments, the number of writing times of "0" may be appropriately counted and the numbers of writing times of both "0" and "1" may be counted. In some embodiments, when the writing in the continuous direction reaches any number (or a predetermined number) of times, the writing in the reverse direction is performed.

Subsequently, a magnetic memory device according to some embodiments will be described with reference to FIG. 10 and FIG. 11.

Figure 10:
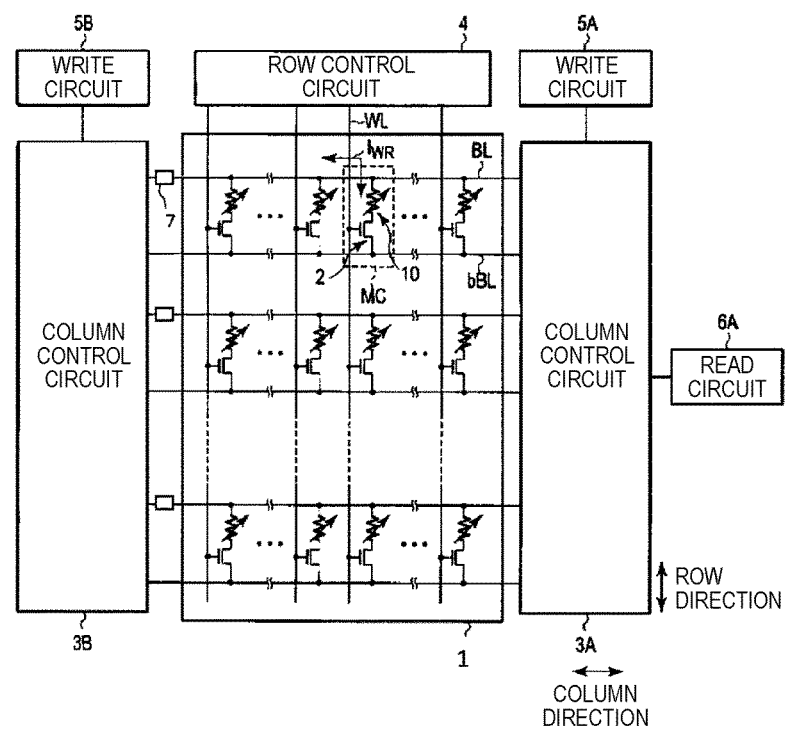
FIG. 10 is a view for describing a memory cell array of a magnetic memory device and a circuit configuration in the vicinity thereof according to some embodiments.
Figure 11:
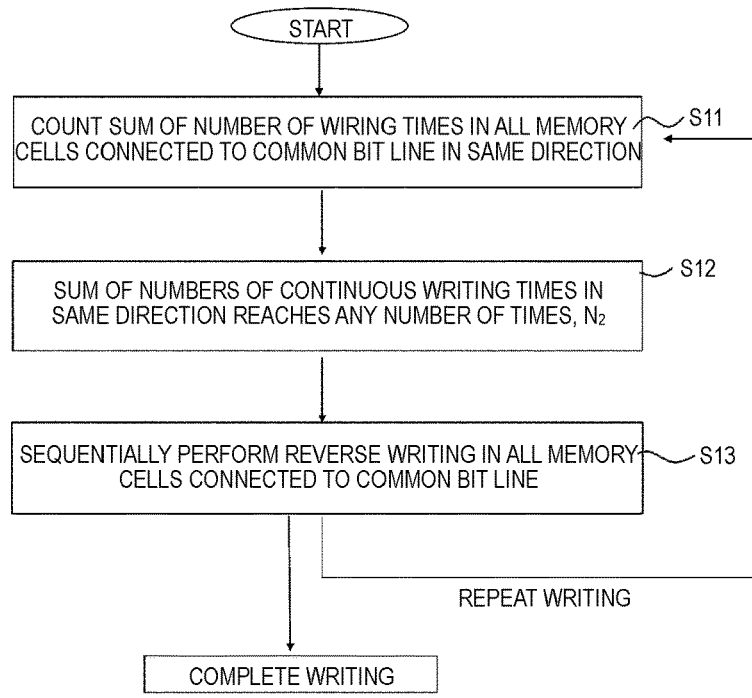
FIG. 11 is a flowchart for describing a writing method of the magnetic memory device according to some embodiments.

The embodiments illustrated in FIG. 10 and FIG. 11 are different from the embodiments illustrated in FIG. 1 to FIG. 9C in that the counter circuit is installed not for each memory cell MC but each bit line.

FIG. 10 is a view for explaining a memory cell array 1 of a magnetic memory device and a circuit configuration in the vicinity thereof according to some embodiments. In some embodiments, as illustrated in FIG. 10, a counter circuit 7 may be installed not for each memory cell MC but for each bit line BL. That is, in some embodiments, one counter circuit may be installed with respect to all memory cells MC connected to a common bit line BL. In some embodiments, the counter circuit 7 is positioned, for example, between a column control circuit 3B and a memory cell array 1. In some embodiments, the counter circuit 7 may selectively sense writing of "0" or writing of "1". In some embodiments, the counter circuit 7 may be located in a location other than that shown in FIG. 10. In some embodiments, the counter circuit 7 may be positioned on a bit line bBL.

Subsequently, a writing method of some embodiments will be described.

FIG. 11 is a flowchart for explaining a writing method of the magnetic memory device according to some embodiments.

In some embodiments, since the counter circuit 7 is installed for, for example, each bit line BL, the counter circuit 7 may count a sum of the numbers of writing times of all memory cells MC (hereinafter referred to as "common cell") connected to the common bit line BL in the same direction (S11). In some embodiments, the counter circuit 7 may count, for example, the number of writing times of "1".

In some embodiments, when continuous writing of "1" of a common cell reaches any number of continuous writing times, N2 (S12), writing of "0" may be performed once with respect to the common cell (S13). The reason is similar to the reason of the embodiments illustrated in FIG. 1 to FIG. 9C.

In some embodiments, the writing of "0" may be performed by, for example, a sequential access from the memory cell MC positioned at an end. In some embodiments, the writing of "0" may be performed with respect to all common cells and any other method may be used.

By the writing method of the magnetic memory device, the embodiments illustrated in FIG. 10 and FIG. 11 may have the same effect as the embodiments illustrated in FIG. 1 to FIG. 9C. In the embodiments illustrated in FIG. 10 and FIG. 11, as compared with the embodiments illustrated in FIG. 1 to FIG. 9C, since the counter circuit is installed not for each memory cell MC but for each bit line, a circuit area may be reduced, thereby providing a smaller magnetic memory device.

Figure 12:
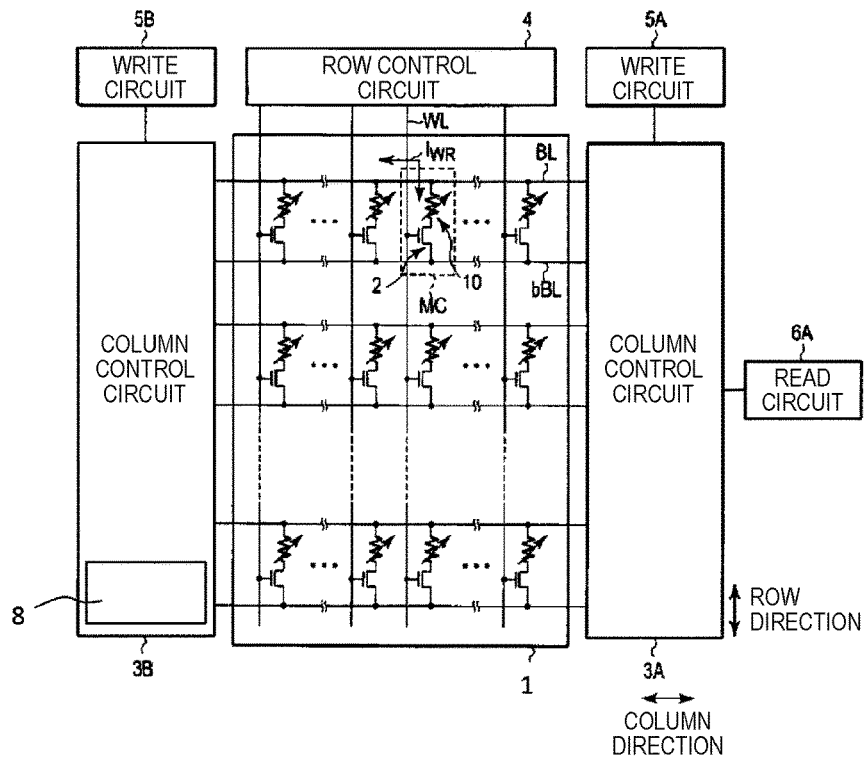
FIG. 12 is a view for describing a memory cell array of the magnetic memory device and a circuit configuration in the vicinity thereof according to some embodiments.

The embodiments illustrated in FIG. 12 to FIG. 13 are different from the embodiments illustrated in FIG. 1 to FIG. 11 in that a time measurement mechanism, rather than the counter circuit, is installed.

FIG. 12 is a schematic view of a memory cell array and a peripheral circuit thereof according to some embodiments. In some embodiments, the magnetic memory device includes, for example, a time measuring mechanism 8 in a column control circuit 3B. In some embodiments, the time measuring mechanism 8 may measure a time, such as a timer, or the like.

Subsequently, the writing method of some embodiments will be described. FIG. 13 illustrates a flowchart of the writing method of some embodiments.

In some embodiments, a writing time in a select cell in the same direction may be measured by the time measuring mechanism 8 (S21). In some embodiments, the writing time may indicate, for example, a time for which current flows in an MTJ element 10. In some embodiments, writing in the same direction represents, for example, continuous writing of "1". In some embodiments, when a continuous writing time in the same direction reaches any writing time T as measured by the time measuring mechanism 8 (S22), a control circuit may once perform the writing in the reverse direction (writing of "0") with respect to the select cell (S23). As a result, it is possible to avoid the risk that a magnetic field below a reference layer 12d becomes unstable due to continuous writing in the same direction, and thus, a writing error frequently occurs.

In some embodiments, the continuous writing time in the same direction may be measured with respect to any select cell as described above, but the sum of the writing times in the same direction may be measured with respect to the common cell. In addition, the writing time of writing of "0" may be measured and each of times of writing of "1" and writing of "0" may be measured.

By the magnetic memory device, the embodiments illustrated in FIG. 12 and FIG. 13 has the same effect as the embodiments illustrated in FIG. 1 to FIG. 11 and furthermore, since the counter circuit need not be installed as compared with the embodiments illustrated in FIG. 1 to FIG. 11, a circuit area may be further reduced, thereby providing a smaller magnetic memory device.

In the description of some embodiments, a component provided "on" or "over" another component can encompass cases where the former component is directly on (e.g., in physical contact with) the latter component, as well as cases where one or more intervening components are located between the former component and the latter component.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A magnetic memory device comprising:
a memory cell array that includes
   a memory cell including a magneto resistive element in which writing is performed by current in a first direction or current in a second direction which is an opposite direction to the first direction,
   a first word line connected with the memory cell, and
   a first bit line connected with the memory cell;
a counter circuit that counts a number of consecutive writing times in the first direction while the counter circuit is in electrical connection with the magneto resistive element; and
a control circuit that performs writing in the second direction in the memory cell when the number of consecutive writing times in the first direction reaches a threshold number of times while the control circuit is in connection with the memory cell array.

2. The magnetic memory device of claim 1, wherein the counter circuit is installed to correspond to the memory cell.

3. The magnetic memory device of claim 1, further comprising:
a plurality of memory cells including the memory cell and connected to the first bit line,
wherein the counter circuit is electrically connected to the plurality of memory cells connected to the first bit line.

4. The magnetic memory device of claim 1,
wherein the magneto resistive element includes
   a storage layer having magnetic anisotropy perpendicular with respect to a film surface,
   a tunnel barrier layer on the storage layer, and
   a reference layer on the tunnel barrier layer and having magnetic anisotropy perpendicular with respect to the film surface.

5. The magnetic memory device of claim 1, further comprising a controller that transmits a control signal to the control circuit.

6. A magnetic memory device comprising:
a memory cell array including
   a memory cell including a magneto resistive element in which writing is performed by current in a first direction or current in a second direction which is an opposite direction to the first direction,
   a word line connected with the memory cell, and
   a bit line connected with the memory cell; and
a control circuit that performs writing in the second direction in the magneto resistive element when a continuous writing time in the first direction in the magneto resistive element reaches a threshold time while the control circuit is in connection with the memory cell array.

7. The magnetic memory device of claim 6, wherein the magneto resistive element includes
   a storage layer having magnetic anisotropy perpendicular with respect to a film surface,
   a tunnel barrier layer on the storage layer, and
   a reference layer on the tunnel barrier layer and having magnetic anisotropy perpendicular with respect to the film surface.

8. The magnetic memory device of claim 6, further comprising a controller that transmits a control signal to the control circuit.

* * * * *